United States Patent
Choi

(10) Patent No.: US 10,559,469 B2
(45) Date of Patent: Feb. 11, 2020

(54) DUAL POCKET APPROACH IN PFETS WITH EMBEDDED SI-GE SOURCE/DRAIN

(71) Applicant: TEXAS INSTRUMENTS INCORPORATED, Dallas, TX (US)

(72) Inventor: Younsung Choi, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 159 days.

(21) Appl. No.: 14/692,017

(22) Filed: Apr. 21, 2015

(65) Prior Publication Data

US 2015/0303061 A1 Oct. 22, 2015

Related U.S. Application Data

(60) Provisional application No. 61/982,430, filed on Apr. 22, 2014.

(51) Int. Cl.
| | |
|---|---|
| *H01L 29/66* | (2006.01) |
| *H01L 29/78* | (2006.01) |
| *H01L 29/10* | (2006.01) |
| *H01L 29/08* | (2006.01) |
| *H01L 21/265* | (2006.01) |

(Continued)

(52) U.S. Cl.
CPC ...... *H01L 21/2652* (2013.01); *H01L 21/2253* (2013.01); *H01L 21/26586* (2013.01); *H01L 29/086* (2013.01); *H01L 29/0878* (2013.01); *H01L 29/1045* (2013.01); *H01L 29/1083* (2013.01); *H01L 29/408* (2013.01); *H01L 29/6659* (2013.01); *H01L 29/66492* (2013.01); *H01L 29/66681* (2013.01); *H01L 29/7816* (2013.01); *H01L 29/7833* (2013.01); *H01L 29/7836* (2013.01); *H01L 29/165* (2013.01);
(Continued)

(58) Field of Classification Search
CPC ............. H01L 21/2652; H01L 21/2253; H01L 21/26586; H01L 21/823412; H01L 21/823807; H01L 29/66492; H01L 29/7833; H01L 29/408; H01L 29/517; H01L 29/7816; H01L 29/66681; H01L 29/1045; H01L 29/086; H01L 29/0878; H01L 29/66537; H01L 29/66606
See application file for complete search history.

(56) References Cited

U.S. PATENT DOCUMENTS

| | | | | |
|---|---|---|---|---|
| 9,299,801 | B1 * | 3/2016 | Bakhishev | ............ H01L 29/105 |
| 2004/0070030 | A1 * | 4/2004 | Chindalore | ....... H01L 29/66825 257/336 |

(Continued)

OTHER PUBLICATIONS

Thompson et al., "A Logic Nanotechnology Featuring Strained-Silicon," IEEE Electron Device Letters, vol. 25, No. 4, Apr. 2004, pp. 191-193.

*Primary Examiner* — Galina G Yushina
(74) *Attorney, Agent, or Firm* — Jacqueline J. Garner; Charles A. Brill; Frank D. Cimino

(57) ABSTRACT

A p-type metal oxide semiconductor field effect transistor (PFET) includes a p-type silicon substrate and an n-type well formed in the p-type silicon substrate. The PFET also comprises a p-type source formed in the n-type well, a p-type drain formed in the n-type well, and dual pockets implanted in the n-type well and coupled to the source and drain. The dual pockets comprise a first pocket with first arsenic n-type dopants and a second pocket with second arsenic n-type dopants.

7 Claims, 3 Drawing Sheets

(51) Int. Cl.
_H01L 21/225_ (2006.01)
_H01L 29/40_ (2006.01)
_H01L 29/51_ (2006.01)
_H01L 29/165_ (2006.01)

(52) U.S. Cl.
CPC ........ _H01L 29/517_ (2013.01); _H01L 29/7848_ (2013.01)

(56) References Cited

U.S. PATENT DOCUMENTS

| | | | | |
|---|---|---|---|---|
| 2006/0081943 | A1* | 4/2006 | Masuoka | H01L 21/26513 257/388 |
| 2006/0157774 | A1* | 7/2006 | Chang | H01L 21/28282 257/315 |
| 2009/0170268 | A1* | 7/2009 | Teo | H01L 21/26586 438/285 |
| 2011/0074498 | A1* | 3/2011 | Thompson | H01L 21/823412 327/543 |
| 2011/0121404 | A1* | 5/2011 | Shifren | H01L 21/823412 257/392 |
| 2013/0154739 | A1* | 6/2013 | Clark | H03F 3/45183 330/257 |
| 2014/0084385 | A1* | 3/2014 | Hoffmann | H01L 29/7833 257/402 |

* cited by examiner

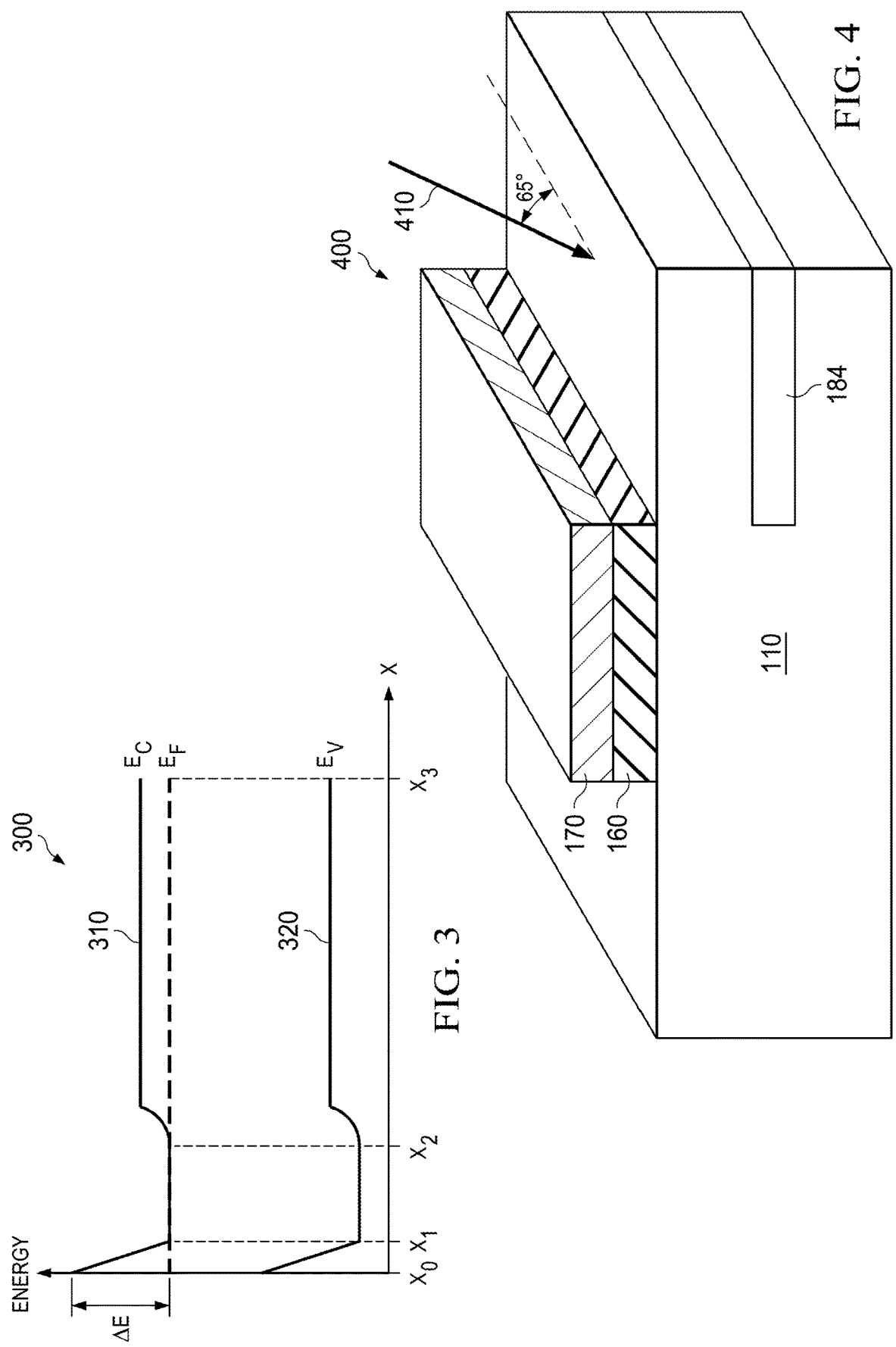

DUAL POCKET APPROACH IN PFETS WITH EMBEDDED SI-GE SOURCE/DRAIN

CROSS-REFERENCE TO RELATED APPLICATIONS

The patent application claims priority to U.S. Provisional Patent Application No. 61/982,430, filed on Apr. 22, 2014, titled "Dual Pocket Approach in PFETS with Embedded SiGe Source/Drain to Improve Performance and Tune Threshold Voltage of Analogue Friendly Components," which is hereby incorporated herein by reference in its entirety.

BACKGROUND

A p-type metal-oxide-semiconductor field effect transistor (PFET) is used in a variety of circuits such as, for example, low-dropout linear regulators (LDOs). PFETs operate by transporting holes in a channel between p-type source and drain. Unfortunately, existing PFETs comprise a large amount of dopants in the channel and therefore suffer from a large threshold voltage in negative and low channel mobility.

SUMMARY

In at least some embodiments, a PFET comprises a p-type silicon substrate and an n-type well formed in the p-type silicon substrate. The PFET also comprises a p-type source formed in the n-type well, a p-type drain formed in the n-type well, and dual pockets implanted in the n-type well and coupled to the source and drain. The dual pockets comprise a first pocket with first arsenic n-type dopants and a second pocket with second arsenic n-type dopants.

In another embodiment, a method of fabricating a PFET comprises forming an n-type well in a p-type silicon substrate. The method also comprises forming a p-type source in the n-type well, forming a p-type drain in the n-type well, implanting first arsenic ions to form a first pocket and second arsenic ions to form a second pocket in the n-type well between the source and the drain.

In yet another embodiment, a PFET comprises a p-type silicon substrate. The PFET also comprises an n-type well formed in the p-type silicon substrate and a p-type source formed in the n-type well. A p-type drain is formed in the n-type well and dual pockets are formed in the n-type well and coupled to the source and drain. The dual pockets comprise a first pocket with first arsenic n-type dopants and a second pocket with second arsenic n-type dopants. A first p-type lightly-doped drain (LDD) is coupled to the source and is provided on the first and second pockets. A second p-type LDD is coupled to the drain and is provided on the first and second pockets. A gate oxide layer is formed on the n-type well and a gate is formed on the gate oxide layer.\

BRIEF DESCRIPTION OF THE DRAWINGS

For a detailed description of exemplary embodiments of the invention, reference will now be made to the accompanying drawings in which:

FIG. 3 shows energy band diagrams of the PFET in FIG. 1 in accordance with some embodiments;

FIG. 4 is a perspective view of a part of the PFET in FIG. 1 in accordance with some embodiments.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

A typical PFET comprises a pocket coupled to the source and the drain which is configured to reduce short channel effect, which indicates the threshold voltage degrades dramatically when the channel of the PFET becomes very short. The pocket (which may also be referred to as halo) comprises phosphorous and arsenic n-type dopants. Because the phosphorous dopants have much smaller sizes than the arsenic dopants, the phosphorous dopants mix with the arsenic dopants evenly inside the pocket. Further, the phosphorous dopants and the arsenic dopants may diffuse into the channel of the PFET. As a result, impurity scattering causes a reduction in channel mobility. Moreover, the threshold voltage of the PFET 100 may be a large negative value due to the high n-type doping concentration in the channel. The embodiments below address these problems.

Figure 1:
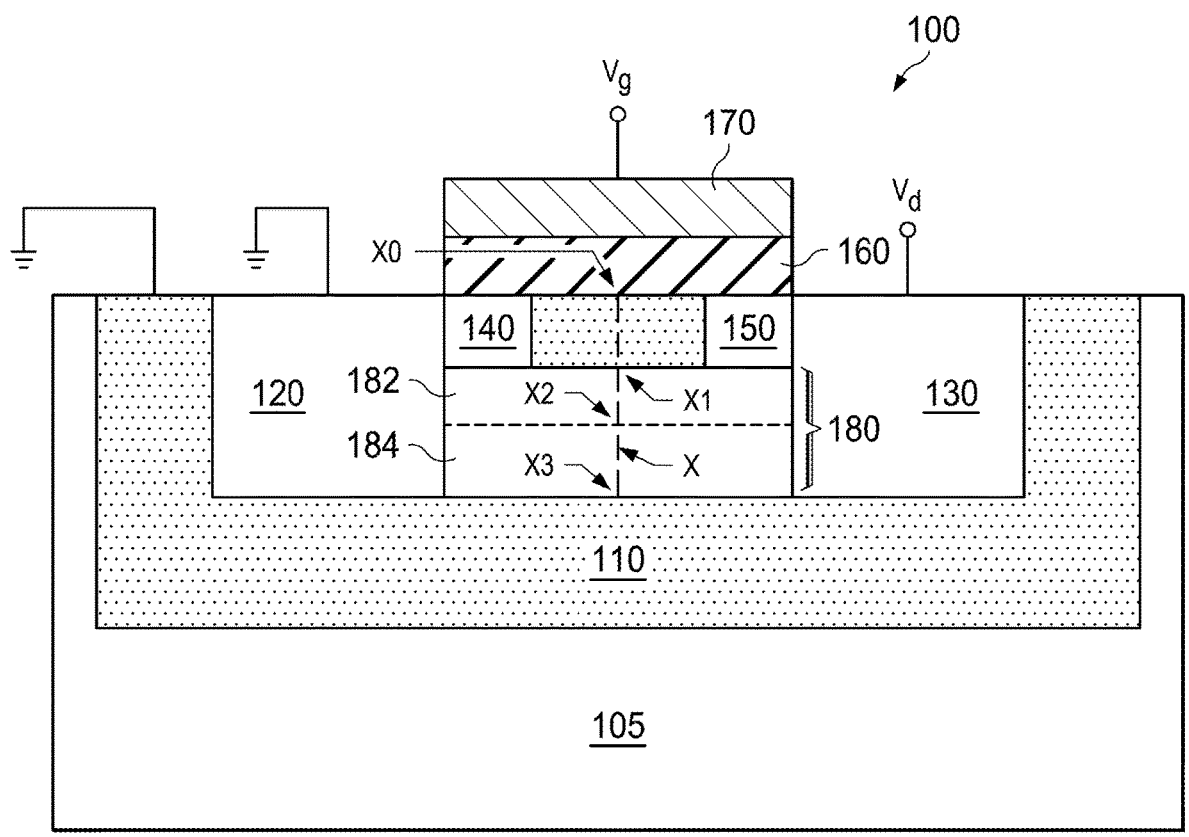
FIG. 1 shows a PFET in accordance with various implementations.

FIG. 1 shows a PFET 100 in accordance with various implementations described herein. The PFET 100 comprises a silicon substrate 105, an n-type well 110, a p-type source 120, a p-type drain 130, a first lightly-doped drain 140, a second LDD 150, dual pockets 180, a gate oxide layer 160, and a gate 170.

The silicon substrate 105 is a p-type doped silicon substrate. The n-type well 110 is inserted into a trench of the silicon substrate 105 and may be referred to as a base layer. Both the p-type source 120 and the p-type drain 130 comprise heavily doped p-type silicon embedded with silicon germanium (SiGe) for enhanced channel mobility. The gate oxide layer 160 is a dielectric layer that separates the gate 170 from the source 120 and the drain 130, and may comprise high-K dielectric. A high-k dielectric material refers to a dielectric material with a dielectric constant greater than 5. A suitable example of a high-k dielectric material is hafnium aluminum oxide (HfAlO). The gate 170 may comprise p-type doped polycrystalline silicon or metal.

The first LDD 140 and the second LDD 150 are configured to reduce the hot carrier effect. The hot carrier effect occurs when the holes jump out of the channel of the PFET 100 under a large electrical potential between the source 120 and the drain 130 and become trapped to the surface of the gate oxide layer 180, which thereby adversely affects the reliability of the PFET 100. The first LDD 140 is coupled to the source 120 and the second LDD 150 is coupled to the drain 130. The first LDD 140 and the second LDD 150 have p-type doping, but at lower doping concentration than the source 120 and the drain 130 in at least some embodiments.

Both the source 120 and the n-type well 110 may be electrically grounded when in use as shown in FIG. 1. A negative voltage $V_g$ is applied on the gate 190 and a negative voltage $V_d$ is applied on the drain 130. When $V_g$ is larger than the threshold voltage in negative, an inversion layer or a channel is formed between the first LDD 140 and the second LDD 150 where holes flow from the source 120 to the drain 130 inside the channel. As a result, an electrical current is generated.

The dual pockets 180 comprise a first pocket 182 and the second pocket 184. Unlike a pocket in other PFETs, which comprises uniform n-type doping concentration of the phosphorous and the arsenic dopants, the first pocket 182 and the second pocket 184 of the example of FIG. 1 comprise only arsenic n-type dopants with different doping concentrations. The n-type doping concentration in the dual pockets may be between 10 and 1000 times larger than the doping concentration in the n-type well 110. The dual pockets are formed underneath the channel with, for example, a two-step implantation process. In the first step, the first pocket 182 is formed by implanting first arsenic ions. In the second step, the second pocket 184 is formed underneath the first pocket 182 as shown in FIG. 1 by implanting second arsenic ions, instead of phosphorous as for other PFETs. Due to the small diffusivity of arsenic dopants compared to phosphorous dopants, the first pocket 182 and the second pocket 184 maintain different n-type arsenic doping concentrations. The energy of the second arsenic ions implantation to form the second pocket 184 is greater than the energy of the first arsenic ions implantation to form the first pocket 182, causing the second pocket 184 to be deeper than the first pocket 182 as shown in FIG. 1.

It should be noted that unlike the channels in some PFETs which are crowded with the phosphorous and the arsenic n-type dopants, the channel in the PFET 100 is formed in the n-type well 110 which does not comprise the phosphorous or the arsenic n-type dopants. The doping concentration of the n-type well 110 is much lower than that of the first pocket 182 and the second pocket 184. The small doping concentration in the channel allows the PFET 300 to have better channel mobility than other PFETs due to suppressed impurity scattering in the channel. Additionally, the small channel doping concentration tunes the threshold voltage resulting in a substantially low threshold voltage of the PFET 100 in different channel directions.

Figure 2:
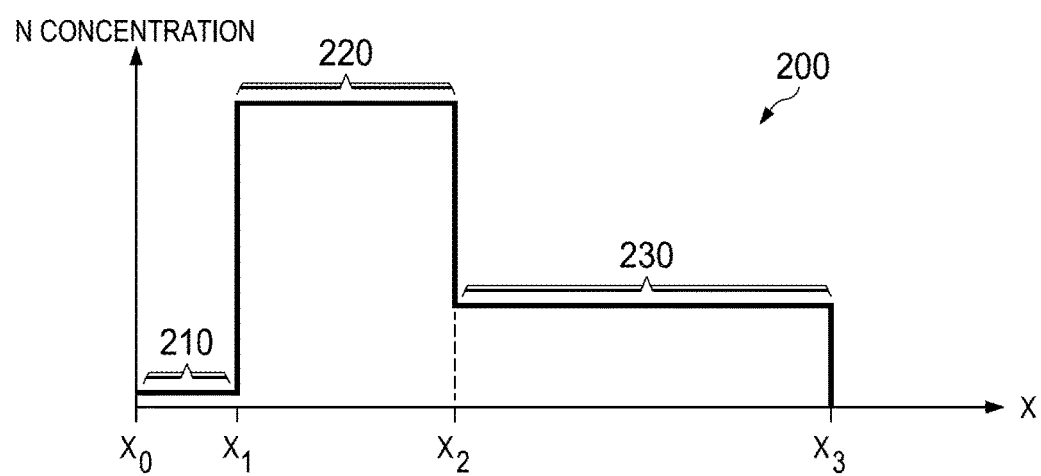
FIG. 2 shows a graph of n-type doping concentration following the X-cut direction in FIG. 1 in accordance with some embodiments.

FIG. 2 shows a graph 200 of n-type doping concentration following the X-cut direction in FIG. 1 in accordance with some embodiments. X axis indicates the position following the X-cut direction in FIG. 1. Position $X_0$ is the interface between the gate oxide layer 160 and the n-type well 110. Position $X_1$ is the interface between the n-type well 110 and the first pocket 182. Position $X_2$ is the interface between the first pocket 182 and the second pocket 184. Position $X_3$ is the interface between the second pocket 184 and the n-type well 110. Y axis indicates the n-type doping concentration. As shown, the n-type doping concentration of the n-type well 110 in the channel (between $X_0$ and $X_1$ 210) is much lower than that of the first pocket 182 (between $X_1$ and $X_2$ 220) and that of the second pocket 184 (between $X_2$ and $X_3$ 230). The n-type doping concentration of the first pocket 182 (between $X_1$ and $X_2$ 220) is higher than that of the second pocket 184 (between $X_2$ and $X_3$ 230). Thus the holes experience less mobility degradation due to impurity scattering. It should be noted that the n-type doping concentration of the first pocket 182 is at least about $10^{16}$ cm$^{-3}$, and is typically between $10^{17}$ cm$^{-3}$ and $10^{18}$ cm$^{-3}$.

FIG. 3 shows energy band diagram 300 of the PFET 100 in accordance with some embodiments. X axis indicates the position following the X-cut direction in FIG. 1. Y axis indicates the energy. Plots 310 and 320 show the conduction band $E_c$ and valence band $E_v$ of the PFET 100, respectively. As can be seen, the Fermi level $E_F$ is closer to the conduction band $E_c$ 310 than the valence band $E_v$ 320 in FIG. 3. This indicates that the PFET 100 is n-type doped following the X-cut in FIG. 1. As shown, the conduction band $E_c$ 310 of the PFET 100 starts at the same energy level as the PFET 100 at position $X_0$, then decreases rapidly until it levels off at the Fermi level between $X_1$ and $X_2$ due to the high doping concentration of the first pocket 182, and finally increases rapidly and levels off again to the position $X_3$. The energy barrier height of the PFET 100 is denoted as $\Delta E$ as shown in FIG. 3. The PFET 100 has smaller $\Delta E$ than other PFETs. As a result, forming the channel in PFET 100 is relatively easy. Further, the gate leakage through the gate oxide layer 160 in the PFET 100 may be reduced as compared with other PFETs.

FIG. 4 is a perspective view 400 of a part of the PFET 100 in FIG. 1 in accordance with some embodiments. FIG. 4 shows the n-type well 110, the second pocket 184, the gate oxide layer 160, and the gate 170 of the PFET 100. The second pocket 184 is formed by implanting the second arsenic ions to the n-type well 110 with a tilt angle in a range from 60° to 70° followed by annealing diffusion. The tilt angle is defined as the angle between the traveling direction 410 of the second arsenic ions and the surface of the n-type well 110. The traveling direction 410 is the direction in which the second arsenic ions travel to the n-type well 110 and are implanted to form the second pocket 184. The implanted profile of the second arsenic ions follows Gaussian distribution.

Figure 5:
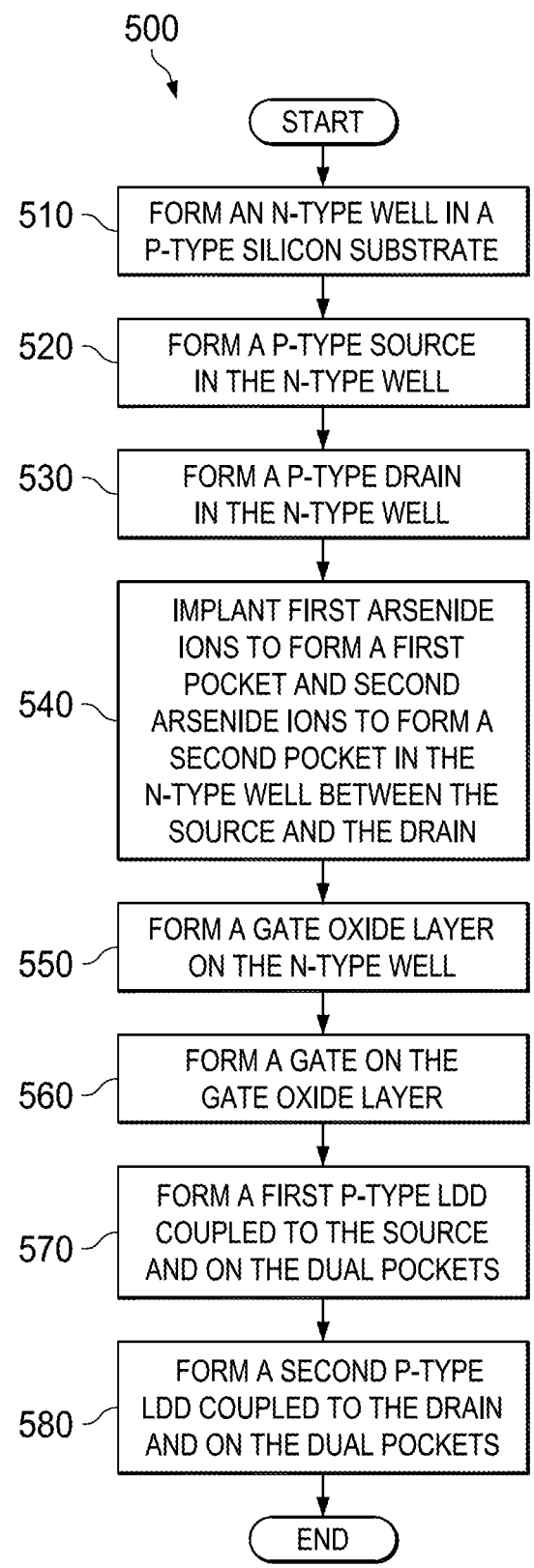
FIG. 5 shows a flowchart illustrating a method of manufacturing the PFET in FIG. 1 in accordance with some embodiments.

FIG. 5 shows a flowchart 500 illustrating a method of manufacturing the PFET 100 in accordance with some embodiments. The various operations can be performed in the order shown, or in a different order as desired. Further, two or more of the operations can be performed in parallel rather than in series.

At step 510, an n-type well is formed in a p-type silicon substrate. At step 520, a p-type source is formed in the n-type well. At step 530, a p-type drain is formed in the n-type well. At step 540, first arsenic ions are implanted to form a first pocket and second arsenic ions are implanted to form a second pocket in the n-type well between the source and the drain. At step 550, a gate oxide layer is formed on the n-type well. At step 560, a gate is formed on the gate oxide layer. At step 570, a first p-type LDD is formed coupled to the source and on the dual pockets. At step 580, a second p-type LDD is formed coupled to the drain and on the dual pockets.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A p-type metal-oxide-semiconductor field effect transistor (PFET), comprising:
   a p-type silicon substrate;
   an n-type well formed in the p-type silicon substrate;
   a p-type source formed in the n-type well;
   a p-type drain formed in the n-type well;

dual pockets formed in the n-type well laterally between the source and drain, the dual pockets comprising a first pocket with first arsenic n-type dopants and a second pocket with second arsenic n-type dopants;

a first p-type lightly-doped drain (LDD) coupled to the source and on the first and second pockets;

a second p-type LDD coupled to the drain and on the first and second pockets, wherein the first pocket is directly below the first LDD and the second LDD, the second pocket is below the first pocket, the first pocket has a higher arsenic n-type doping concentration than the second pocket, and both the first pocket and the second pocket have a higher n-type doping concentration than the n-type well;

a gate oxide layer formed on the n-type well; and a gate formed on the gate oxide layer.

2. The PFET of claim 1, wherein the n-type doping concentration of the first pocket is at least about $10^{16}$ cm$^{-3}$.

3. The PFET of claim 1, wherein the n-type doping concentration of the first pocket is between $10^{17}$ cm$^{-3}$ and $10^{18}$ cm$^{-3}$.

4. The PFET of claim 1, wherein the source and the drain comprise silicon germanium (SiGe).

5. The PFET of claim 1, wherein the first p-type LDD and the second p-type LDD have doping concentrations that are smaller than that of the p-type source and the p-type drain.

6. The PFET of claim 1, wherein the gate oxide layer comprises a dielectric material with a dielectric constant greater than 5.

7. The PFET of claim 6, wherein the dielectric material comprises hafnium aluminum oxide (HfAlO).

* * * * *